(12) United States Patent
Baret et al.

(10) Patent No.: US 6,395,344 B1
(45) Date of Patent: May 28, 2002

(54) METHOD FOR PRODUCING A MAGNESIA BASED DEPOSIT

(75) Inventors: Guy Baret, Grenoble; Michel Labeau, Eybens; Olivier Renault, Grenoble, all of (FR)

(73) Assignee: Thomson multimedia, Boulogne Billancourt (FR)

(*) Notice: Subject to any disclaimer, the term of this patent is extended or adjusted under 35 U.S.C. 154(b) by 0 days.

(21) Appl. No.: 09/446,647

(22) PCT Filed: Jun. 12, 1998

(86) PCT No.: PCT/FR98/01240

§ 371 (c)(1),
(2), (4) Date: Mar. 16, 2000

(87) PCT Pub. No.: WO98/59090

PCT Pub. Date: Dec. 30, 1998

(30) Foreign Application Priority Data

Jun. 24, 1997 (FR) .............................................. 97 07853

(51) Int. Cl.$^7$ ................................................. B05D 1/04
(52) U.S. Cl. .................... 427/475; 427/126.3; 427/226; 427/255.19; 427/255.29; 427/314; 427/407.2; 427/419.2; 427/421; 427/422; 427/561; 427/565; 427/600; 427/601
(58) Field of Search .......................... 427/126.2, 126.3, 427/226, 422, 314, 561, 421, 565, 475, 600, 601, 407.2, 419.2, 255.19, 255.29

(56) References Cited

FOREIGN PATENT DOCUMENTS

FR              2738392        3/1997     ............ H01J/17/49

OTHER PUBLICATIONS

O. Stryckmans et al, Formation of MGO Films by Ultrasonic Spary Pyrolysis from BETA–Diketonate, Thin Solid Films, vol. 283, No. 1/2, Sep. 1, 1996, pp. 17–25.

Anonymous: "Inexpensive Method for the Application of High Secondary Emission Protective Coatings Onto Plasma Display Panels" IBM Technical Disclosure Bulletin, vol. 27, No. 7B, Dec. 1984, p. 4478.

I. Koiwa et al. "Preparation of MgO protective layer for Ac–type plasma display panel by means of screen–printing" Journal of the Electrochemical Society, May 1995, vol. 142, No. 5, pp. 1396–1401.

*Primary Examiner*—Bernard Pianalto
(74) *Attorney, Agent, or Firm*—Joseph S. Tripoli; Dennis H. Irlbeck; Carlos M. Herrera

(57) ABSTRACT

The present invention relates to a method for carrying out a magnesium oxide based deposition on the dielectric surface of a glass plate of a display panel. The method includes the creation of a mist from a metalorganic compound of magnesium dissolved in a solvent, the conveying of the mist to the dielectric surface of the plate, the evaporation the solvent when approaching the dielectric surface of the plate which is taken to a temperature of about 380° to 430°, and the pyrolysis of the metalorganic compound leading to the magnesium oxide based deposit on the surface of the plate and the evaporation of the organic radical of the compound, this deposit being practically waterproof. The method is especially useful in the manufacture of plasma panels.

15 Claims, 2 Drawing Sheets

METHOD FOR PRODUCING A MAGNESIA BASED DEPOSIT

FIELD OF THE INVENTION

The present invention pertains to the manufacture of display panels and especially plasma panels.

BACKGROUND OF THE INVENTION

A plasma panel has two dielectric plates each comprising an array of conductive electrodes. These plates, formed out of a glass substrate, are joined to each other in an imperviously sealed manner, the arrays of electrodes being substantially orthogonal. The two plates demarcate a gas-filled space. Each intersection of electrodes defines a cell where discharges can be made into the gas.

In this type of display panel, the plates comprise a dielectric layer that is typically an enamel type of layer insulating the electrodes from the gas. This dielectric layer limits the discharge current by storing the charges created by ionization and gives the panel a memory effect.

By supplying the electrodes with an alternating sustaining signal, it is possible to dissociate the functions of addressing and light energy generation thus making it possible to build large-sized panels. This type of display panel has high technological simplicity and is particularly robust.

The dielectric layer is generally made by means of an enamel based on lead oxide, silica and boron oxide ($PbO$, $SiO_2$, $B_2O_3$). The dielectric layer placed on the front plate of the panel, namely the face seen by an observer, is generally transparent while the layer placed on the rear plate is generally white in order to return a maximum amount of light towards the front.

It is standard practice to cover the dielectric surface of the plates with a deposit based on magnesium oxide ($MgO$) to protect it from bombardment by the ions of the gas, reduce the voltage needed for a discharge to be produced and ensure the temporal stability of the voltage needed for the discharge.

In color plasma panels, the gas is generally a mixture of neon, xenon and helium. The ionizing of the gas prompts an emission of ultraviolet rays that excites a mosaic of luminophors deposited on the magnesium oxide based layer of one of the two plates between two electrodes of a network.

The magnesium oxide based deposit must have a high secondary transmission coefficient and must provide perfect electrical insulation. The making of this deposit should not cause any deterioration in the dielectric plate. The magnesium oxide based deposit must withstand the subsequent treatment to which the plate has to be subjected without undergoing dissociation while at the same time playing its role of protecting the dielectric layer. The subsequent operations of treatment to which a plate is subjected are: the depositing of the luminophors that integrate aqueous phase treatment operations, and the sealing operation which is done at temperatures of about 400° C.

At present, the magnesium oxide based deposition is done by vacuum evaporation. This operation requires a secondary vacuum chamber working with a pressure lower than or equal to $10^{-5}$ hectopascals. An electron gun is placed in the vacuum chamber. It heats the magnesium oxide by bombarding it, thus prompting its evaporation and its deposition on the dielectric plate. The deposition is done at about 100° C. The installation used for this deposition is costly. The duration of the deposition is relatively lengthy, for thicknesses of about 300 to 500 nanometers are required and the production rates cannot be high.

This operation of deposition which is already costly for medium-sized plates (with a 49 centimeter diagonal) becomes even greater for large-sized plates whereas one of the promising features of the plasma display panels is that it is quite adapted to large formats (with a diagonal of 150 centimeters or even more).

Another major drawback of this method of deposition by vacuum evaporation relates to the quality of the deposition. The inventors have observed that the deposits obtained are mechanically and chemically not stable enough, deteriorate under the effect of ion bombardment, especially under the effect of xenon ion bombardment and do not properly play their role of protection during the deposition of the luminophors. Indeed, it turns out to be the case that deposition by vacuum evaporation leads to a low density magnesium oxide based layer with relatively large intergranular spaces making it permeable to water. This explains firstly its sensitivity to ion bombardment and secondly its insufficiency in properly protecting the dielectric layer during the aqueous phase treatment. The water, by infiltrating into the pores thus formed, is able to reach the dielectric layer and cause damage to it. Measurements have shown porosity levels of about 30% to 40%.

Ion effects and the deterioration of the dielectric layer leads to pollution of magnesium oxide, the contamination of the interior of the gas space and an insufficient lifetime for the panels thus made.

It is an object of the present invention to propose a method for carrying out a magnesium oxide based deposition on the dielectric surface of a glass plate of a display panel that leads to a layer that is waterproof in such a way that it is practically insensitive to ion effects and does not cause any deterioration of the plate during the deposition or during subsequent operations of treatment to which the plate may be subjected. In particular, it must be borne in mind that the dielectric surface of the plate cannot be heated intensely, beyond about 430° C. Otherwise, there would be deformation, and this is unacceptable.

To achieve this result, the method according to the invention comprises at least the following steps:

the creation of a mist from a metalorganic compound of magnesium dissolved in a solvent, the conveying of the mist to the dielectric surface of the plate, the evaporation of the solvent when approaching the dielectric surface of the plate which is taken to a temperature of about 380° C. to 430° C., the pyrolysis of the metalorganic compound leading to the magnesium oxide based deposit on the surface of the plate and the evaporation of the organic radical of the compound, this deposit being practically waterproof.

As a metalorganic compound, it is possible to use magnesium acetate or magnesium acetonate acetyl.

An organic solvent such as butanol or methanol for example may be chosen.

The mist is obtained preferably by means of an ultrasound generator plunged into the solution. A particularly homogeneous nebulization is then obtained.

The mist is conveyed towards the dielectric surface of the plate by means of a vector gas such as air, pure oxygen or a mixture of nitrogen and oxygen. This gas contributes to the transformation of magnesium into magnesium oxide by oxidation.

It is preferable that the mist should be preheated when it is being conveyed, this preheating taking place preferably in a conduit through which the mist passes. In an installation of continuous disposition, it would be useful for the plate to be capable of shifting with respect to a nozzle by which the conduit ends.

A case may be envisaged where the magnesium oxide based deposition contains a dopant to improve its electrical properties. The dopant may be, for example, calcium oxide, yttrium oxide or barium oxide.

In this variant, the solution will contain a metalorganic compound whose metal radical corresponds to the dopant.

BRIEF DESCRIPTION OF THE DRAWINGS

The present invention will be understood more clearly from the following description of modes of implementation given by way of non-restrictive examples. This description refers to the appended figures, of which.

DETAILED DESCRIPTION OF THE PREFERRED EMBODIMENT

Figure 1:
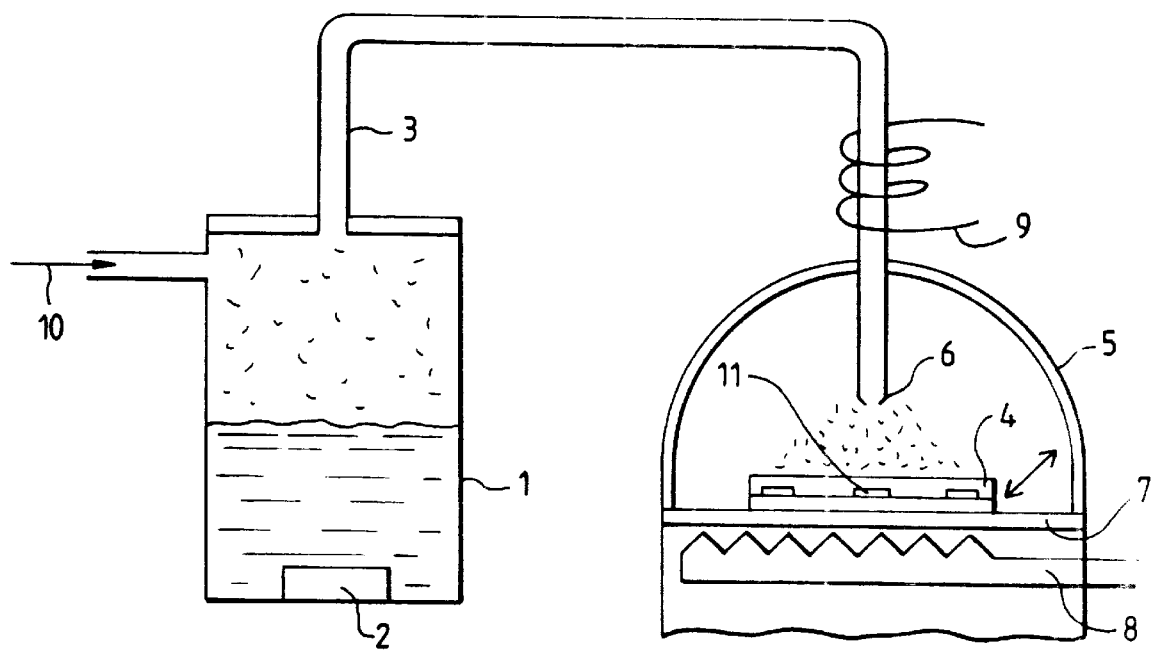
FIG. 1 is a drawing of an installation for the implementation of the method according to the invention.

According to the invention, the method used for carrying out a magnesium oxide based deposition on the dielectric surface of a plate of a display panel comprises a step in which mist is created from a solution comprising a metalorganic compound of magnesium dissolved in a solvent. Reference is made to FIG. 1.

The solution is contained in a receptacle 1 fitted out with a generator 2 of droplets to nebulize the solution. This generator is preferably an ultrasound generator that plunges into the solution in the low part of the receptacle 1. It is preferable that the solution should be at a substantially constant temperature and that the receptacle 1 should be thermostat-controlled. An operation of nebulization by ultrasound gives the mist a high degree of homogeneity with droplets of substantially the same size, leading to a deposit whose thickness is substantially uniform. Other techniques of nebulization could nevertheless could be envisaged, for example mechanical ones.

A vector gas 10 is introduced into the top part of the receptacle 1 so as to provide for the conveyance of the mist towards the dielectric surface of the plate. The plate 4 shown, which it is assumed to be that of a plasma display panel, is formed by a glass substrate whose surface is enameled. This substrate comprises electrodes 11 beneath the enamel.

The receptacle 1 is closed and ends in its upper part in a conduit 3 designed to be crossed by the mist. This conduit 3 opens into a chamber 5 in the vicinity of the surface of the plate 4 and ends in a nozzle 6.

The metalorganic compound may for example be magnesium acetate or magnesium acetonate acetyl. The solvent may be organic and chosen from among butanol and methanol for example.

For the concentration of the solution, the limit of solubility gives satisfactory results.

The vector gas 10 will preferably be air. This simplifies the making of the installation and leads to the oxidation of magnesium into magnesium oxide. However, as a gas vector, it is also possible to use pure oxygen or any mixture of nitrogen and oxygen. A flow rate of 2 liters per minute is sufficient to convey the mist if the section of the conduit is equal to some square centimeters.

Under such conditions, the creation of the mist and its conveyance may be done at ambient temperature and atmospheric pressure. This is particularly simple to make and far less costly than installation under vacuum. However, it is preferable to preheat the mist before it reaches the nozzle, in taking it to a temperature of 200° C. to 300° C. This heating can be done by heating the conduit 3. A heating device is shown in FIG. 1 under the reference 9.

In the chamber 5, the dielectric surface of the plate 4 is taken to a temperature of about 380° C. to 430° C., enabling an evaporation of the solvent as it is approached and a dissociation by pyrolysis of the metalorganic compound, leading to a deposition of magnesium oxide on the dielectric surface and an evaporation of the organic radical of the compound. In the chamber 5, preferably the atmospheric pressure will also be preserved.

Conditions of this kind lead to a deposition of polycrystallized magnesium oxide, practically without an amorphous region and sufficiently dense to be practically waterproof. A deposition of this kind, which is mechanically and chemically far more stable, withstands ion bombardment. By limiting the surface temperature of the plate to about 430° C., there is no risk of damaging its enamelled layer.

The heating of the surface of the plate 4 can be done by means of a plate 7 heated by an electrical resistor 8 on which the plate is positioned. However, other heating devices can be envisaged, for example the use of infrared heating.

In an industrial installation for continuous deposition, it is preferable to shift the plates 4 and keep the nozzle 6 fixed.

Figure 2A:
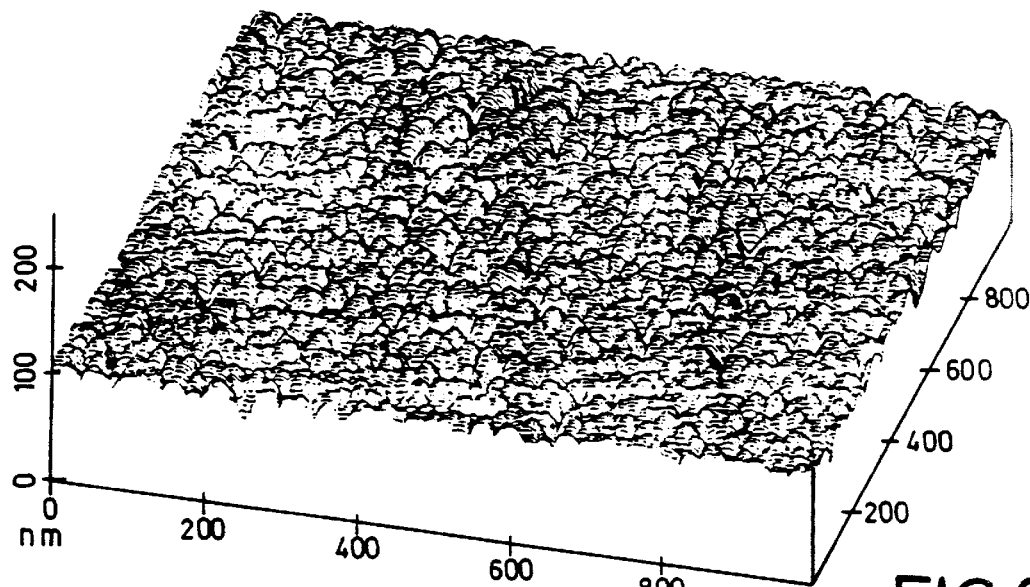
FIGS. 2a, 2b show the surface condition of magnesium oxide depositions obtained respectively by vacuum evaporation and by the method according to the invention.
Figure 2B:
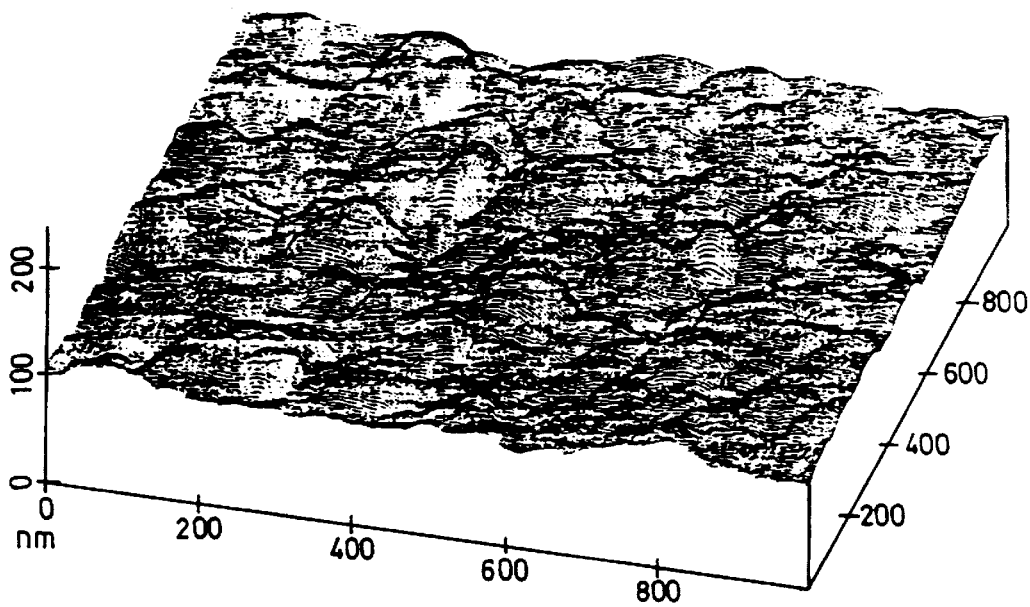

FIGS. 2a, 2b show the surface condition of the magnesium oxide deposits obtained respectively by vacuum evaporation and by the method according to the invention. These depictions are obtained by examination under atomic force microscope (AFM).

FIG. 2b shows a far smoother surface condition than that of FIG. 2a with grains that are three to four times bigger. The intergrandular space seems to be almost zero in FIG. 2b while in FIG. 2a there are perfectly visible non-contiguous grains.

Examination under X-ray diffraction shows <111> and/or <200> crystal orientations that are very pronounced and do not enable the detection of an amorphous phase.

Several trials of magnesium oxide deposition by the method that has just been described were made. They show that the crystal quality and the purity of the deposit are perfectly reproducible from one trial to another under the same conditions. The magnesium oxide coated plates are quite compatible with the electrical characteristics of operation of a plasma panel and their lifetime has been increased.

Instead of depositing pure magnesium oxide on the plate, it may become necessary to add a dopant to it, thus making it possible to improve its electrical properties and especially to reduce the voltage necessary to obtain a discharge. The dopant may be calcium oxide (CaO), yttrium oxide ($Y_2O_3$) or barium oxide (BaO) for example. In this case, the solution will contain a metalorganic compound dissolved in the solvent whose metal radical corresponds to the dopant. In the example of calcium oxide, the metalorganic compound could be calcium acetate for example. In the deposit made, the magnesium oxide remains preponderant for the calcium oxide has no role other than that of a dopant. At the heated dielectric surface, the calcium acetate will also get dissociated by pyrolysis and the calcium oxide will be deposited in a mixture with the magnesium oxide.

What is claimed is:

1. Method for carrying out a magnesium oxide based deposition on a dielectric surface of a glass plate of a display panel, comprising the steps of:

creating a mist from a metalorganic compound of magnesium dissolved in a solvent, conveying the mist, by means of a vector gas which contributes to the conversion by oxidation of the magnesium into magnesium oxide, to the dielectric surface of the plate wherein the plate is heated to a temperature ranging from about 380° C. to 430° C., whereby the magnesium oxide is deposited on the surface of the plate.

2. Method for carrying out a magnesium oxide based deposition according to claim 1, wherein the concentration of magnesium compound in the solvent is the limit of solubility.

3. Method for carrying out a magnesium oxide based deposition according to claim 1, wherein the solvent is an organic solvent.

4. Method for carrying out a magnesium oxide based deposition according to claim 1, wherein the solvent is butanol or methanol.

5. Method for carrying out a magnesium oxide based deposition according to claim 1, wherein the dielectric surface of the plate is enamelled.

6. Method for carrying out a magnesium oxide based deposition according to claim 1, wherein the mist is obtained by means of an ultrasound generator plunged into the solution.

7. Method for carrying out a magnesium oxide based deposition according to claim 1, wherein the temperature is maintained at a substantially constant temperature.

8. Method for carrying out a magnesium oxide based deposition according to claim 1, wherein the vector gas is air, pure oxygen or a mixture of air and nitrogen.

9. Method for carrying out a magnesium oxide based deposition according to claim 1, wherein the mist is conveyed to the dielectric surface of the plate in a conduit that ends in a nozzle and is preheated in the conduit.

10. Method for carrying out a magnesium oxide based deposition according to claim 9, wherein the plate is capable of shifting with respect to a nozzle by which the conduit ends.

11. Method for carrying out a magnesium oxide based deposition according to claim 1, wherein the magnesium oxide based deposit contains a dopant improving its electrical properties.

12. Method for carrying out a magnesium oxide based deposition according to claim 11, wherein the dopant is chosen from among calcium oxide, yttrium oxide and barium oxide.

13. Method for carrying out a magnesium oxide based deposition according to claim 11, wherein the solution also contains a metalorganic compound whose metal radical corresponds to the dopant.

14. Method for carrying out a magnesium oxide based deposition according to claim 1, wherein the display panel is a plasma panel.

15. Method for carrying out a magnesium oxide based deposition according to claim 1, wherein the mist is conveyed to the dielectric surface of the plate in a conduit that ends in a nozzle and is preheated before reaching the nozzle.

* * * * *